Figure 1:
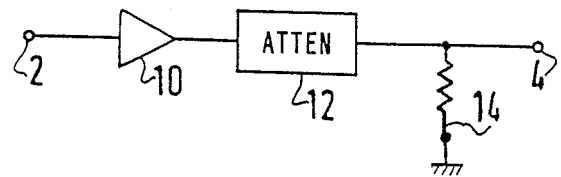

United States Patent [19]

Boutigny

[11] Patent Number: 4,803,423
[45] Date of Patent: Feb. 7, 1989

[54] INPUT CIRCUIT FOR A PROBE OF A LOGIC ANALYSER AND PROBE AND LOGIC ANALYSER PROVIDED WITH SUCH A CIRCUIT

[75] Inventor: Pierre-Henri Boutigny, Epinay-sous-Senart, France

[73] Assignee: U.S. Philips Corp., New York, N.Y.

[21] Appl. No.: 55,659

[22] Filed: May 28, 1987

[30] Foreign Application Priority Data

Jun. 6, 1986 [FR] France ................. 86 08185

[51] Int. Cl.⁴ ................. G01R 19/06; G01R 19/00
[52] U.S. Cl. ................. 324/130; 324/72.5; 341/118
[58] Field of Search ................. 324/72.5, 123, 128, 324/130, 149, 158 P, 158 F; 307/264, 300, 292; 340/347 CC, 661-663, 641

[56] References Cited

U.S. PATENT DOCUMENTS

| | | | |
|---|---|---|---|
| 3,810,031 | 5/1974 | Poujois | 330/9 |
| 3,857,048 | 12/1974 | de Lange de Meux et al. | 307/264 |
| 3,893,103 | 7/1975 | Prill | 340/347 CC |
| 4,001,808 | 1/1977 | Ebihora et al. | 340/663 |
| 4,042,881 | 8/1977 | Webb, Jr. | 324/72.5 |
| 4,217,542 | 8/1980 | Abbe et al. | 324/130 |
| 4,229,703 | 10/1980 | Bustin | 340/347 CC |
| 4,251,803 | 2/1981 | Debord et al. | 340/347 CC |
| 4,491,968 | 1/1985 | Shimp et al. | 340/661 |
| 4,498,058 | 2/1985 | Benrud . | |
| 4,663,586 | 5/1987 | Swelein et al. | 324/130 |

FOREIGN PATENT DOCUMENTS 0805022 11/1936 France ................. 324/72.5

OTHER PUBLICATIONS

"DVM Reaches 10 nV Sensitivity Through Novel Front-End Design", by Dance, Electron. Industry, 11/80, pp. 14-20.
"Study of Space Potential Matter", by Minami et al., Mem. Fac. Eng., Osaka City Univ. (Japan), vol. 16, 12/75, pp. 55-62.

*Primary Examiner*—Reinhard J. Eisenzopf
*Assistant Examiner*—W. Burns
*Attorney, Agent, or Firm*—Bernard Franzblau

[57] ABSTRACT

A high frequency probe for a logic analyzer adapted to operate with different types of logic circuits, and signals which may or may not be superimposed on a dc component. After an input capacitance, a high frequency amplifier feeds both an output terminal and a compensator circuit which compares the deviation between low frequency or dc components appearing at the input and output terminals, and compensates for the deviation by reinjecting a signal at the input of the high frequency amplifier. Variable attenuation may also be be included between the high frequency amplifier and the output terminal.

12 Claims, 2 Drawing Sheets

INPUT CIRCUIT FOR A PROBE OF A LOGIC ANALYSER AND PROBE AND LOGIC ANALYSER PROVIDED WITH SUCH A CIRCUIT

The invention relates to an input circuit for a probe of a logic analyser for frequency high logic signals comprising between an input terminal and an output terminal a high-frequency amplifier having a high input impedance and an amplification less than one, which supplies an output signal at a low impedance arranged between the output terminal and earth.

It further relates to a logic probe and to a logic analyser provided with such an input circuit.

A circuit of this kind is known from U.S. Pat. No. 4,498,058, which discloses an amplifier having a low input capacitance intended to form a probe for an oscilloscope. This probe serves to analyse electrical signals having rise times of the order of 1 nanosecond with a dynamic range in voltage of ±10 V at a load impedance of 50Ω. In order that a high input impedance (5 MΩ) and a low input capacitance (0.5 pF) are obtained, the input transistor is a field effect transistor.

Such an input circuit can schematically be decomposed into a high-frequency amplifier having a high input impedance followed by a fixed attenuator and a low-impedance (50Ω) coaxial connection. Such a circuit has a fixed attenuation coefficient, which is not very suitable to analyse standardized logic signals, whose dynamic ranges are greatly different, for example 5 V for a TTL logic circuit or 0.8 V for an ECL logic circuit. On the other hand, these logic signals, especially the ECL signals, have a d.c. component and in the case of the circuit according to the prior art such a d.c. component (also having a low frequency) is transmitted by such a circuit. The detection of logic signals having a small amplitude superimposed on a d.c. component, which is sometimes higher, may give rise to difficulties with respect to detection, which is a source of errors. This problem becomes more serious due to the fact that these low-frequency d.c. components are not stable and are subjected to variations, especially with temperature.

An object of the invention is therefore to suggest an input circuit which permits of transmitting to a logic analyzer signals which have short rise and fall times and can be controlled or programmed for dynamic ranges of varied amplitudes.

Another object of the invention is to eliminate the d.c. component of the logic signal in order that the accuracy of the detection of the logic signals superimposed on a d.c. component is increased.

Another object is for a given dynamic range that detection thresholds lying in the overall excursion can be accurately determined so that indications with respect to the rise and fall times of the logic signals can be derived therefrom.

Therefore the invention as defined in the opening paragraph is characterized in that the input circuit comprises a capacitance arranged between the input terminal of the circuit and the input of the amplifier and a compensation circuit in parallel between the input and output terminals comparing a deviation between the low-frequency d.c. components of the respective signals occurring at these two terminals and supplying a compensation signal intended to compensate for this deviation at the input terminal of the amplifier by means of an injection element, the compensation circuit having an input controlled by a d.c. signal subject to a given offset in order to compensate for the d.c. component.

An accurate analysis of the logic input signals can be realized only with circuits having a high input impedance so that the input capacitance must have a very low value. This value is of the order of 1 pF in order to ensure the required accuracy in the proximity of 1 GHz, which represents the maximum limit of the logic signals to be analysed. For these frequencies, the sampling is effected towards 2 GHz.

In order to determine the rise and fall times of the input signals, the analog-to-digital conversion takes place over 2 bits. This can be realized by means of GaAs comparators.

The input circuit having a pass band of 1 GHz exhibits rise times equal to or less than about 300 ps, which may give rise to problems of delay of transmission in the connection cables. For this purpose, the invention utilizes per signal one connection analogous to a single cable, which permits of eliminating the propagation dispersions in multiple cables. The analog-to-digital conversion is then effected in the logic analyser itself.

This further has the advantage that the volume of the probe is reduced by reducing the number of connection cables.

The capacitance arranged at the input of each high-frequency amplifier causes the high-frequency component of the input signal (maximum about 1 GHz) to pass. The compensation circuit derives directly at the input terminal the low-frequency d.c. components of the input signal. In the same manner, the compensation circuit is connected to the output terminal and also derives the low-frequency d.c. components of the signals at the output terminal. The compensation circuit compares these types of components and generates a compensation signal, which is introduced at the input terminal of the high-frequency amplifier in order to ensure that the deviation between these two types of components is as small as possible. The compensation circuit further has an input to which a d.c. offset signal can be applied, which is intended to compensate for the d.c. component of the logic signal to be analysed.

Thus, a negative feedback loop is obtained, which is formed by the high-frequency amplifier and by the compensation circuit through its compensation output and one of its inputs.

This control loop controls the stability and regulates all the variations, the non-linearities and the stabilization of the high-frequency amplifier. The d.c. stabilization is of the order of 1 mV.

The invention further has for its object to permit the analysis of logic signals having different dynamic ranges. For this purpose, at the output of the high-frequency amplifier an attenuator is arranged, which can be controlled by an attenuation control signal in a programmable manner. This attenuator is constituted by a field effect transistor (FET) arranged in parallel with a resistor between the output of the amplifier and the output terminal. The gate of this FET, for example of GaAs, is controlled by the attenuation control signal, which acts at the same time upon compensation circuit in order that the compensation obtained is attenuated to the same extent. Thus, a logic input signal having a dynamic range of 5 V can be attenuated to 0.5 V, which permits of substantially reducing the output current in the impedance of 50Ω supplied by an "emitter-follower" circuit.

This input circuit is connected through a coaxial connection of 50Ω to comparators situated, for example, in the logic analyser itself in order that the analog-to-digital conversion is effected. Due to this input circuit, the comparators can be adjusted with a high accuracy to given threshold values. This first permits of ensuring a very high detection reliability for the logic analyser and further of detecting the trigger instants for thresholds lying, for example, at 20%, 50% and 80% of the maximum excursion and of thus determining the rise and fall times of the logic signals by means of a single connection.

The compensation circuit, which processes the low-frequency d.c. components, is constituted by operational amplifiers.

The input circuit is used to form a probe. The latter comprises a movable part of very small dimensions constituted by the capacitance, the high-frequency amplifier and the injection element. It can also comprise the variable attenuation stage. This movable part is connected through coaxial connections of 50Ω to the fixed part of the probe, which either can be arranged in the logic analyser or can constitute a housing accomodating the logic analyser.

This probe transmits the signals in an analog form, the analog-to-digital conversion being effected in the analyser itself over 1 or 2 bits. This permits of reducing the volume of the probe so that the number of connection wires is considerably reduced with respect to a construction in which the analog-to-digital conversion is effected at the area at which the signal is derived. This is an input circuit, whose design is adapted to the problems of the logic analysers with multiple performances and a simplified construction with respect to the prior art. The logic probe has therefore a reduced cost price.

Figure 2:
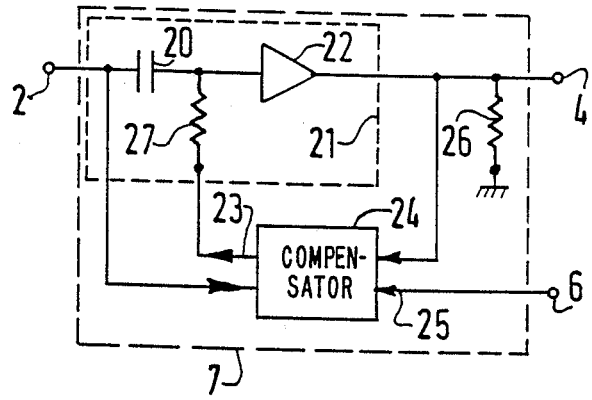
Figure 3:
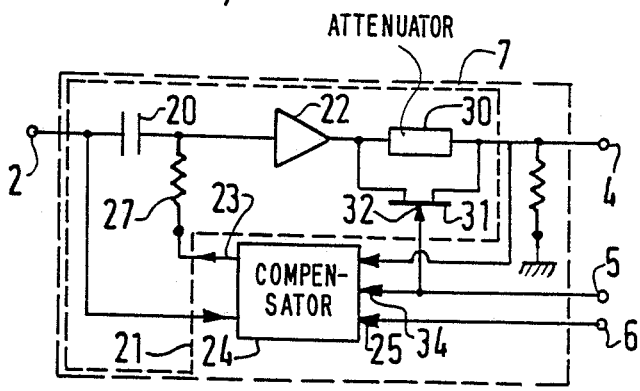
Figure 5:
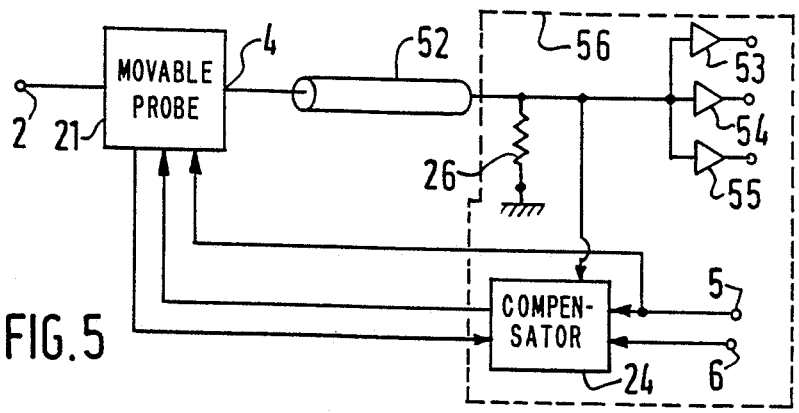
Figure 4:
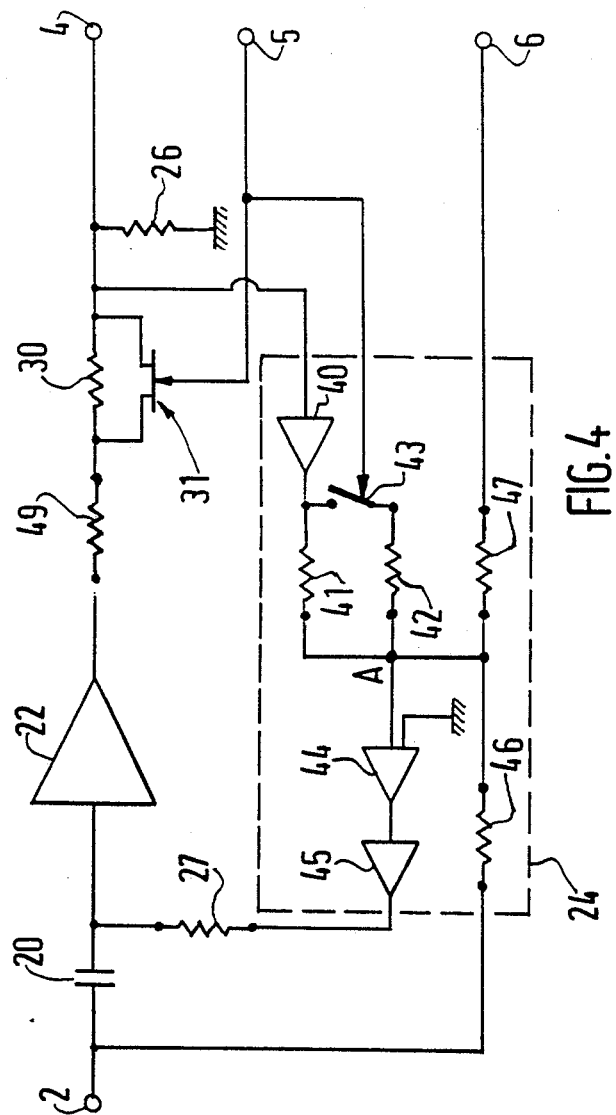

In order that the invention may be readily carried out, it will now be described more fully, by way of example, with reference to the accompanying drawing, in which:

FIG. 1 shows diagrammatically an input circuit according to the prior art,

FIG. 2 shows an electric circuit diagram of an input circuit according to the invention, FIG. 3 shows an electric circuit diagram of an input circuit analogous to that of FIG. 2 moreover having programming of the attenuation, FIG. 4 shows an electric circuit diagram analogous to that of FIG. 3 with a more detailed representation of the compensation circuit, FIG. 5 shows an electric circuit diagram of a logic probe comprising such a circuit connected to the comparators of the logic analyser.

FIG. 1 shows a circuit diagram of an input circuit according to the prior art (U.S. Pat. No. 4,498,058). A high-frequency amplifier 10 having a high input impedance is arranged in series with a fixed attenuator 12 between an input terminal 2 and an output terminal 4. The latter is connected to earth through a resistor 14 of low value, generally 50Ω. The overall amplification of such an input circuit is fixed and, for example with an amplification of 0.1, there is at the output a signal of 0.5 V for TTL signals and of 0.8 V for ELC signals. However, the low-frequency d.c. components pass in this input circuit and no offset correction is possible to suppress the d.c. component, which otherwise can vary with, for example, temperature. Accurate thresholds cannot be directly determined with such a circuit so that rise and fall times cannot be determined after the analog-to-digital conversion.

FIG. 2 shows an electric circuit diagram of an input circuit 7 according to the invention. Between the input terminal 2 and the output terminal 4 are arranged in series a capacitance 20 and a high-frequency amplifier 22. A compensation circuit 24 for the low-frequency d.c. components derives the low-frequency d.c. signals occurring at the intput terminal 2 and the output terminal 4. The circuit 24 generates a compensation signal at the output 23 in order that the distance between the signals of the two terminals tends to be cancelled. This compensation signal is introduced through an injection element 27 at the input of the high-frequency amplifier. The compensation circuit 24 receives at an input 25 a d.c. offset signal originating from a terminal 6, which is determined in order to compensate for the d.c. component in the input signal. The output terminal 4 is connected to a resistor 26 of low impedance, for example of 50Ω. The movable part 21 of the probe comprises the capacitance 20, the amplifier 22 and the element 27.

FIG. 3 shows an electric circuit diagram of an input circuit analogous to that shown in FIG. 2, in which the same elements are provided with the same reference numerals, but which comprises an attenuator which permits of limiting the output dynamic range, of programming or adapting it to the signals to be analysed and of thus limiting the current supplied by the high-frequency amplifier.

For this purpose, the parallel-combination of a resistor 30 and a field effect transistor 31 is arranged between the output of the amplifier 22 and the output terminal 4. The gate 32 of this transistor is controlled and the transistor is made conducting or non-conducting by an attenuation signal originating from a terminal 5 which also leads to a terminal 34 of the compensation circuit 24. It is also possible to attenuate at the same time the high-frequency path and the low-frequency path for direct current.

The movable part 21 of the probe comprises besides the preceding elements the variable attenuation stage.

FIG. 4 indicates in greater detail the electric circuit diagram of the compensation circuit 24. An inverter amplifier 40 having an amplification −1 is connected to the output of the attenuator 30, 31 and to the junction point of a resistor 41 and of an interruptor 43. The other terminal of the interruptor 43 is connected to a resistor 42, which is in turn connected to the resistor 4 at the point A. Thus, depending upon the position of the interruptor, the equivalent resistor is equal to the resistor 41 of high value, for example 5 kΩ or to the value of the resistor 41 in parallel with the resistor 42 of lower value, for example 1 kΩ.

The point A is connected to an input of an operational amplifier 44, whose other input is connected to earth. The output of the amplifier 44 is connected to the input of an inverter amplifier 45, which injects the compensation signal through the element 27 at the input of the high-frequency amplifier 22. This element 27 may be a resistor, but use is preferably made of a transistor in order to carry out the current compensation. The compensation circuit 24 derives the input signal by means of a resistor 46 having a value R. Likewise, the offset signal originating from the terminal 6 is applied to the point A through a resistor 47.

The negative feedback loop for the low-frequency d.c. components provides for the re-introduction of the signal at the input terminal of the high-frequency amplifier, i.e. after the input capacitance. The dynamic range required for the compensation is thus equal to the dynamic range of the input signal. The real part of the input impedance of the loop varies from the value R at low frequencies to the value R in parallel at Zc if Zc is the resistive part of the input impedance Ze of the high-frequency amplifier 22.

When:
Zp represents the input impedance of the probe measured at the point 2,
Ze represents the input impedance of the high-frequency amplifier,
Zs represents the output impedance of the source of logic signals, and
R represents the value of the resistor 46,
G being the amplification obtained between the signals at the output 4 and the input 2, the variations in amplification DG of the amplification G between the low frequency and the high frequency is obtained by:

$$\frac{DG}{G} = \frac{DZp}{Zp}\left(1 - \frac{Zp}{Zs + Zp}\right).$$

when the input impedance variations of the probe are:

$$\frac{DZp}{Zp} = \frac{R}{R + Ze}$$

there is obtained by the variations of the amplification as a function of the source impedance:

$$\frac{DG}{G} = \frac{R}{Ze}\left(1 - \frac{R}{Zs + R}\right).$$

These relative variations are the same irrespective of the state of the attenuator constituted by the transistor 21 and the resistor 30.

According to a preferred embodiment, in which R=10 kΩ, Zs=1 kΩ and ZE is higher than 100 kΩ, the maximum variation in amplification is 1%.

The high-frequency amplifier is of conventional design comprising an output stage having two transistors with common collectors and supplying their output current to a load impedance 100Ω (2×50Ω). The low cut-off frequency of the amplifier is about 200 Hz in order to avoid stability problems due to the limited pass band of the negative feedback loop for direct current and low frequency. A resistor 49 having a value equal to that of the resistor 26, for example 50Ω, is arranged at the output of the high-frequency amplifier 22 in order to form the load impedance of 100Ω when the field effect transistor 31 is conducting. Its resistor then has a value less than about 6Ω and its parasitic elements are very small. The resistor 30 is in this case, for example, 400Ω. Thus, with a TTL signal having a dynamic range of 5 V and an attenuation of 10, a dynamic range of 0.5 V is obtained at the output. Likewise, with an ECL signal having a dynamic range of 1 V and an attenuation of 2, a dynamic range of 0.5 V is obtained at the output.

FIG. 5 shows an electric circuit diagram of a logic probe comprising several input circuits according to the invention, only one of which is shown in the Figure. The movable part 21 of the probe has at its output 4 a signal which is transmitted through a coaxial line 52 of 50Ω constituted by a cable connected to the fixed part 56 secured to the logic analyser. The load resistor 26 is preferably arranged behind the connection of 50Ω. The fixed part comprises comparators, the number of which depends upon the desired accuracy of conversion.

These comparators, for example of GaAs and three in number, 53, 54, 55 are each adjusted to a given threshold value, for example to 20%, 50% and 80% of the maximum excursion. The use of comparators adjusted to 50% permits of carrying out an analog-to-digital conversion at 1 bit. The use of the comparators adjusted to 20% and 80% permits of carrying out an analog-to digital conversion over 2 bits and of deriving therefrom the rise and fall times of the signal from a treatment effected in the logic analyser.

The circuit diagram of FIG. 5 is used for each logic input signal to be treated. For example in the case in which there are 8 signals to be treated, 8 input circuits 7 are arranged in a probe with 8 connections for the output signals, then a connection for deriving the input signal, a connection for attenuation and a connection for the offset voltage. The supply voltage of the amplifiers must definitely be added thereto. Such a probe is connected to a logic analyser, which varies out the interpretation of the analysed signals.

What is claimed is:

1. An input circuit for a probe of a logic analyzer for high frequency logic signals comprising: a high-frequency amplifier coupled between an input terminal and an output terminal, said high-frequency amplifier having a high input impedance, an amplification less than one, and an output which supplies an output signal to a low impedance arranged between the output terminal and ground, characterized in that a capacitance is connected between the input terminal of the circuit and an input of the amplifier, and a compensation circuit is coupled in parallel between the input and output terminals for comparing a deviation between low-frequency d.c. components of respective signals occurring at the input and output terminals and supplying a compensation signal intended to compensate for said deviation to the input of the amplifier by means of an injection element, the compensation circuit having an input controlled by a d.c. signal subject to a given offset in order to compensate for the d.c. component.

2. An input circuit as claimed in claim 1, further comprising a variable attenuation stage coupled between the output of the amplifier and the output terminal, said variable attenuation stage including a series resistor connected in parallel with a field effect transistor, whose gate potential is controlled by an attenuation signal which also controls the compensation circuit in order to obtain the same attenuation in the high-frequency path and in the low-frequency/direct current path.

3. An input circuit as claimed in claim 2, characterized in that the field effect transistor is made of gallium arsenide.

4. A probe for a logic analyser comprising at least one input circuit as claimed in claim 1, the input circuit comprising a movable part including the capacitance, the high-frequency amplifier and the injection element, the movable part being connected through coaxial connections to a fixed part comprising the compensation circuit which is integral with the logic analyser.

5. A probe for a logic analyser comprising at least one input circuit as claimed in claim 2, the input circuit comprising a movable part including the capacitance, the high-frequency amplifier, the injection element and the variable attenuation stage, the movable part being connected through coaxial connections to a fixed part comprising the compensation circuit which is integral with the logic analyser.

6. A probe as claimed in claim 5, characterized in that each input circuit comprises at least one comparator arranged in the fixed part of detecting a given level and supplying a comparison signal.

7. A probe as claimed in claim 6, characterized in that at least one output of the input circuit is connected to several comparators in order to determine the rise and fall times of the logic signal.

8. A probe as claimed in claim 6, characterized in that there are three comparators, the respective given levels being approximately 20%, 50% and 80% of the maximum excursion in order to determine the rise and fall times of the logic signals.

9. A probe as claimed in claim 6, characterized in that the comparators are made of gallium arsenide.

10. A logic analyser, characterized in that it comprises at least one probe as claimed in claim 4.

11. A probe as claimed in claim 4 characterized in that each input circuit comprises at least one comparator arranged in the fixed part for detecting a given level and supplying a comparison signal.

12. A probe as claimed in claim 11 characterized in that at least one output of the input circuit is connected to several comparators in order to determine the rise and fall time times of the logic signal.

* * * * *